(12) United States Patent
Urban et al.

(10) Patent No.: US 9,252,787 B2
(45) Date of Patent: Feb. 2, 2016

(54) METHOD FOR CONTROL OF PHASE IN AN OSCILLATORY CIRCUIT

(75) Inventors: Martin Urban, Lorrach (DE); Tobias Brengartner, Freiburg (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 320 days.

(21) Appl. No.: 13/808,154

(22) PCT Filed: Jun. 20, 2011

(86) PCT No.: PCT/EP2011/060204
§ 371 (c)(1),
(2), (4) Date: Jan. 3, 2013

(87) PCT Pub. No.: WO2012/004116
PCT Pub. Date: Jan. 12, 2012

(65) Prior Publication Data
US 2013/0106477 A1 May 2, 2013

(30) Foreign Application Priority Data
Jul. 6, 2010 (DE) .......................... 10 2010 030982

(51) Int. Cl.
*H03L 7/091* (2006.01)
*G01F 23/296* (2006.01)
(52) U.S. Cl.
CPC ............ *H03L 7/091* (2013.01); *G01F 23/2966* (2013.01)
(58) Field of Classification Search
CPC .......................... H03L 7/091; G01F 23/2966
USPC .............. 331/1 R, 18, 25, 135; 327/156–158; 310/319, 316.03
See application file for complete search history.

(56) References Cited

U.S. PATENT DOCUMENTS

| 7,436,100 | B2 | 10/2008 | D'Angelico |
| 7,902,928 | B2 | 3/2011 | Wang |
| 2005/0073454 | A1 | 4/2005 | Honma |
| 2006/0131994 | A1 | 6/2006 | D'Angelico et al. |

(Continued)

FOREIGN PATENT DOCUMENTS

| CN | 1675523 A | 9/2005 |
| CN | 101505150 A | 8/2009 |

(Continued)

OTHER PUBLICATIONS

S.M. Kashmiri et al., "Measuring the Thermal Diffusivity of CMOS Chips," Sensors, 2009 IEEE, Piscataway, NJ, USA, Oct. 25, 2009, pp. 45-48, XP031618533, ISBN: 978-1-4244-4548-6.

(Continued)

*Primary Examiner* — Jeffrey Shin
(74) *Attorney, Agent, or Firm* — Bacon & Thomas, PLLC

(57) ABSTRACT

A method for the control of a phase shift between a transmission signal and a received signal of an electromechanical transducer unit to a predetermined value in an oscillatory circuit. The received signal is sampled at discrete points in time predetermined based on the transmission signal. Sampled voltage values are compared with desired values, which the received signal assumes at the respective points in time, when the predetermined phase shift is present, and, in the case of a deviation of a voltage value from its desired value, based on the sign of the deviation, the frequency of the transmission signal is decreased or increased.

8 Claims, 2 Drawing Sheets

(56) References Cited

U.S. PATENT DOCUMENTS

| | | |
|---|---|---|
| 2008/0013665 A1 | 1/2008 | Werker et al. |
| 2011/0248753 A1* | 10/2011 | Leistner .................. 327/156 |
| 2012/0085165 A1 | 4/2012 | Hortenbach et al. |
| 2012/0119758 A1 | 5/2012 | Urban |

FOREIGN PATENT DOCUMENTS

| DE | 102 37 931 A1 | 2/2004 |
|---|---|---|
| DE | 10 2009 026 685 A1 | 12/2010 |
| DE | 10 2009 028 022 A1 | 2/2011 |

OTHER PUBLICATIONS

German Search Report dated Jun. 27, 201, issued in Application No. 10 2010 030 982.9 in Munich Germany.

International Preliminary Report on Patentability dated Sep. 21, 2011, issued in PCT/EP2011/060204 in Rijswijk, Netherlands.

International Preliminary Report on Patentability dated Jan. 17, 2013, issued in PCT/EP2011/060204 in Geneva, Switzerland.

* cited by examiner

METHOD FOR CONTROL OF PHASE IN AN OSCILLATORY CIRCUIT

TECHNICAL FIELD

The present invention relates to a method for control of a phase shift between a transmission signal and a received signal of an electromechanical transducer unit to a predetermined value in an oscillatory circuit. The electromechanical transducer unit is, for example, a piezoelectric drive, which excites an oscillatable unit to execute mechanical oscillations. Such an oscillatory system is found, for example, in vibronic fill level- or flow measuring devices.

BACKGROUND DISCUSSION

The exciting of vibronic oscillatory systems, composed of an oscillatable unit and a electromechanical transducer unit, occurs, most often, by means of an analog oscillatory circuit. The oscillatory circuit provokes oscillation with the frequency, at which the phase shift between transmission signal and received signal of the electromechanical transducer unit fulfills the oscillatory circuit condition, i.e., together with the remaining phases arising in the oscillatory circuit, a natural multiple of 360° results. The analog electronic components of such an oscillatory circuit are matched specially to the particular oscillatory system, e.g. to an oscillatory fork with a certain geometry, so that one oscillatory system is not easily replaceable by another, without replacing the oscillatory circuit with one correspondingly matched.

Likewise known are methods, in the case of which the oscillatory system is excited by means of a so-called PLL (phase locked loop) to execute oscillations at a certain phase relationship. This control loop can be embodied with analog parts or partially or completely digitally. A digital PLL has the advantage that it is adaptable to other oscillatory systems. Disadvantageous, however, is that, for exciting by means of a digital PLL, an increased electrical current consumption is needed, since the hardware resources must be driven.

SUMMARY OF THE INVENTION

An object of the invention is to provide a method of the initially named type, which is universally applicable for different oscillatory systems and whose implementation is possible with little electrical current consumption. Another object of the invention is to provide an oscillatory system equipped apparatus for performing the method.

The object is achieved as regards method by features including that the received signal is sampled at discrete points in time predetermined based on the transmission signal, that sampled voltage values are compared with desired values, which the received signal assumes at the respective points in time, when the predetermined phase shift is present, and that, in the case of a deviation of a voltage value from its desired value, based on the sign of the deviation, the frequency of the transmission signal is decreased or increased. The transmission signal can also be referred to as exciter, or driving, signal.

In order to retain the tuned-in, predetermined phase shift, respectively to correct a possibly occurring deviation, the current phase shift of the received signal is monitored and, in given cases, corrected. The invention utilizes the fact that, besides the relationship between predetermined phase shift and oscillation frequency, there is also a relationship between the current voltage value of the received signal and the phase shift. If the phase shift between transmission- and received signal equals the predetermined phase shift, then, based on the timing of the transmission signal, information is available concerning at which points in time the received signal has zero crossings and extrema. If the present phase shift deviates from the predetermined phase shift, then the received signal has, at these points in time, values, which do not correspond to the desired values, i.e. they are not zero or not maximum, or minimum. For this reason, these points in time are referred to herein as points in time of potential zero crossing and potential maximum or minimum in the received signal. If the phase shift is, for example, less than the predetermined phase shift, then the received signal has, at the point in time where the first zero crossing should be, a positive voltage value and, at the point in time where the second zero crossing should be, a negative voltage value. From the comparison of the measured voltage values of the received signal with the desired values, it can, consequently, be determined, whether the excitation frequency must be decreased or increased, in order to achieve the predetermined phase shift. The control of phase shift, respectively frequency, occurs purely digitally. This enables a space saving embodiment of the electronics unit in the case of application in a measuring device. Furthermore, the digital oscillatory circuit is adaptable individually to the oscillatory system to be excited and is, thus, universally applicable.

In a first embodiment of the solution of the invention, the electromechanical transducer unit is excited to execute oscillations at the beginning of the control with a frequency, at which the transmission signal at least approximately has the predetermined phase shift relative to the received signal. In order to be able to control the phase shift reliably, the phase shift at a starting point must approximately equal the predetermined phase shift. For this, the approximate frequency is preferably located and set by means of a frequency sweep. The performing of a frequency sweep is described in the as yet unpublished German patent application No. 102009026685.2. An advantageous further development of the method described there is described in the as yet unpublished German patent application No. 102009028022.7.

In a further development of the method of the invention, the deviation of the existing phase shift from the predetermined phase shift is quantitatively registered and the frequency increased or decreased corresponding to the quantitative deviation. If the amplitude of the received signal is known, then e.g. via the voltage value at the point in time, at which a received signal of the predetermined phase shift would assume an extreme value, it can be determined how strongly the phase shift deviates from the predetermined phase shift, respectively, the value of the phase shift can be determined. From this, it can about be ascertained, how strongly the frequency must be corrected, in order to obtain the predetermined phase shift.

In an embodiment of the invention, at least one voltage value is sampled within an oscillation period. Preferably, one or two voltage values are sampled. If the amplitude of the received signal is constant and known, the sampling of one point per oscillation period is sufficient to determine how fast the correction should, in given cases, be performed. If the amplitude of the received signal changes, then, in this case, at least two sampled points per oscillation period are necessary, preferably one potential zero crossing and the potential maximum of the received signal.

In the case of an advantageous embodiment of the method, the received signal is sampled at points in time, at which the received signal crosses zero when the predetermined phase shift is present. Sampling can be at the times for one zero crossing per period or two zero crossings per period. In applications with lesser requirements on the speed of control, an option is also not to scan points in each period.

Another embodiment of the method provides that the received signal is sampled at points in time, at which the received signal is at an extreme when the predetermined phase shift is present. In other words, the sampled point corresponds to the maximum or the minimum of the received signal, if the current phase shift between transmission signal and received signal would correspond to the predetermined phase shift.

In an embodiment of the method, the voltage value sampled at a point in time, at which the received signal is extreme when the predetermined phase shift is present, is compared with the voltage value sampled at a point in time, at which the received signal has a zero crossing when the predetermined phase shift is present, and, from the comparison, the frequency is determined, with which readjusting is performed. The sampling both at times for zero crossings, as well as also at times for extreme values, is advantageous in the case of varying received amplitude, since then the deviation from zero measured at the time for a zero crossing can be set in relation to the current amplitude. In this way, it is determinable, how strongly the frequency must be readjusted. In the case of constant amplitude of the received signal, the knowledge concerning the voltage value at the time for a zero crossing is sufficient to determine how strong the readjusting must be.

Furthermore, the invention relates to an apparatus for determining and/or monitoring at least one process variable. The apparatus includes an oscillatable unit, a driving/receiving unit, which excites the oscillatable unit to execute mechanical oscillations and receives oscillations from such and converts them into an electrical, received signal, and a control/evaluation unit, which produces from the received signal a transmission signal for the driving/receiving unit, wherein the frequency of the transmission signal is set in such a manner that essentially a predetermined phase shift is present between the transmission signal and the received signal. The apparatus is distinguished by features including that the control/evaluation unit is embodied in such a manner that it controls the phase shift between transmission signal and received signal to the predetermined value, wherein the control/evaluation unit samples the received signal at discrete points in time predetermined based on the transmission signal, compares sampled voltage values, in each case, with a desired value, which the received signal assumes at the respective point in time, when the predetermined phase shift is present, and, in the case of a deviation, decreases or increases the frequency of the transmission signal based on the sign of the deviation. The control of phase is digitally implemented, so that the control/evaluation unit is adaptable to different oscillatable units and applications without modification of the hardware.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1A:
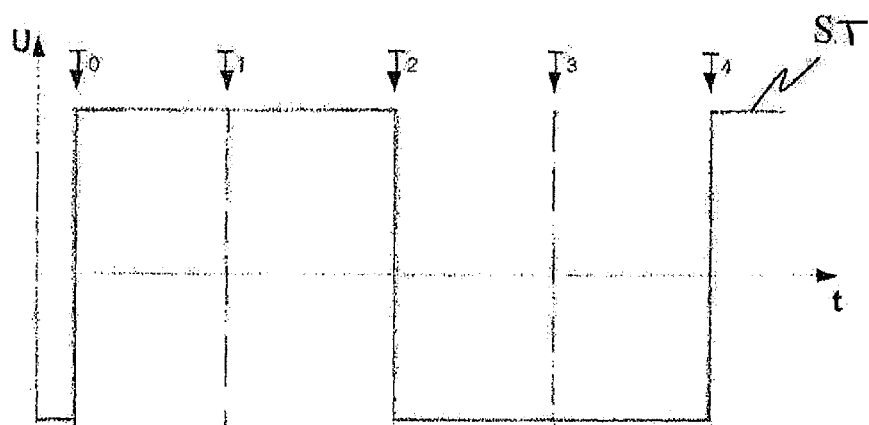
FIG. 1a-FIG. 1c are typical transmission signals, two received signals shifted in phase relative to the transmission signal, and the sampling points in time.
Figure 1B:
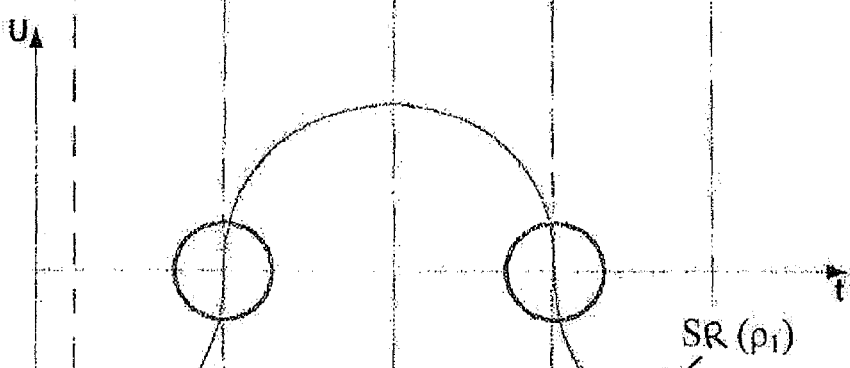
Figure 1C:
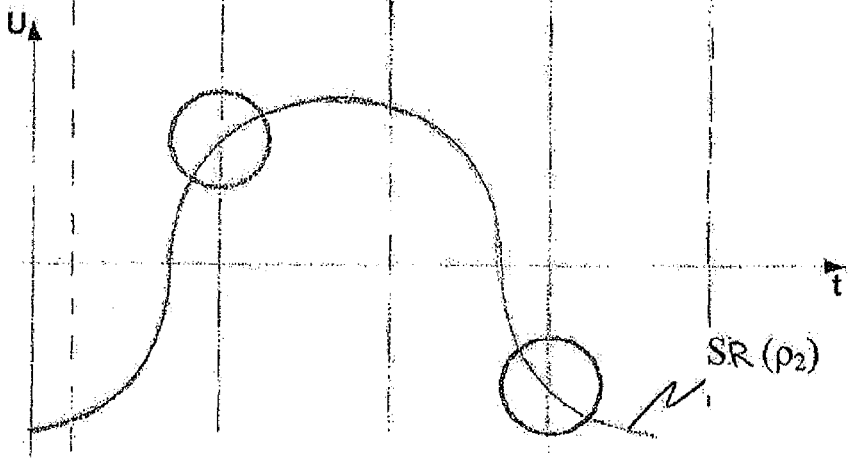

FIG. 1a shows a transmission signal ST in the form of a rectangular voltage. FIGS. 1b and 1c show sinusoidal received signals SR. The received signal shown in FIG. 1b has a phase shift $\rho_1$ of 90° relative to the transmission signal. FIG. 1c shows a received signal with a phase shift $\rho_2$ different from $\rho_1$.

The illustrated points in time $T_i$ are those points in time based on the transmission signal, at which the received signal is sampled, i.e. points in time at which zeros, maxima or minima are expected. They depend on the predetermined phase shift $\rho$ and result from the zero position $T_0$ of the transmission signal selected as starting value and the period P of the transmission signal in the following way:

$$T_i = T_0 + \frac{\rho + (i-1) \cdot 90°}{360°} \cdot P$$

wherein $i \in N$ and $1 \leq i \leq 4$

For the illustrated case, it is assumed that the predetermined phase shift $\rho$ is 90°. The received signal is sampled at least at the points in time $T_1$ and/or $T_3$, since zeros are expected at these points in time. The received signal shown in FIG. 1b does actually have zeros at $T_1$ and $T_3$, i.e. its phase shift $\rho_1$ corresponds to the predetermined phase shift $\rho=90°$ and the transmission frequency is correctly set.

The voltage value of the received signal illustrated in FIG. 1c is, however, positive at the point in time $T_1$ and negative at the point in time $T_3$. In other words, the received signal is located at $T_1$ such that it is rising and near the maximum, i.e. the zero was crossed through already at an earlier point in time. From this it follows that the phase shift $\rho_2$ of this received signal is less than 90°. The phase shift for low frequencies lies at 0° and rises for high frequencies to 180°, wherein, in the case of the eigenfrequency, the required phase shift of 90° is present. In order to reach the required phase shift $\rho=90°$, the frequency of the transmission signal must, consequently, be increased.

Figure 2:
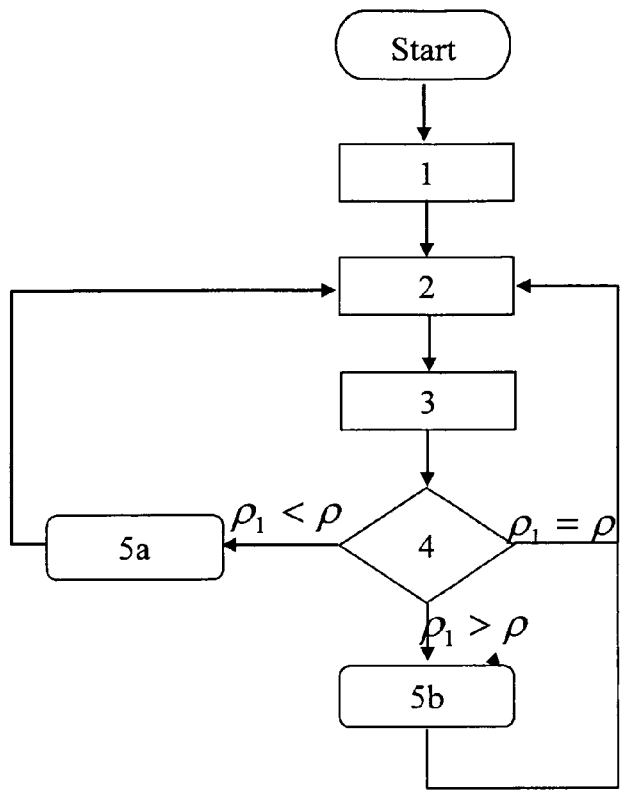
FIG. 2 is a flow diagram of the method of the invention.

FIG. 2 shows a flow diagram of a preferred embodiment of the method of the invention. In step 1, the oscillatory system is excited to execute oscillations by means of a frequency sweep. In this way, that frequency is set for the transmission signal, which corresponds to the predetermined phase shift $\rho$, for example, the eigenfrequency in the case of a 90° phase shift between transmission signal and received signal. As a function of the respective application of the oscillatory system, for example, in the case of oscillation in a viscous medium as a function of the viscosity, the specification of another phase shift $\rho$ can be necessary.

In step 2, the received signal is sampled at certain predetermined points in time based on the transmission signal. In this embodiment, the amplitude of the received signal displays no weakening compared with the amplitude of the transmission signal. In this case, the received signal is sampled at the points in time, at which it would, in the case of presence of the predetermined phase shift $\rho$, have zero crossings. Also only one zero crossing can be sampled within a period. In an alternative embodiment, especially in the case of varying amplitude of the received signal, the potential maximum and/or minimum is supplementally sampled.

In step 3, the measured voltage values are compared with the respective desired values and the sign and height of a deviation determined. The height of the deviation is here determinable by using the known amplitude. Serving for this in the case of varying amplitude is at least one additional sampling point at the potential maximum and/or minimum. From this, the existing phase shift $\rho_1$ is determined.

In step 4, it is determined whether the existing phase shift $\rho_1$ agrees with the predetermined phase shift $\rho$. Correspondingly, from the result of this comparison, in the next step, the frequency of the transmission signal is adjusted, i.e. decreased or increased, in case the currently existing phase shift $\rho_1$ deviates from the predetermined phase shift $\rho$.

In case the existing phase shift $\rho_1$ is less than the value of the predetermined phase shift $\rho$, in step 5a, an increasing of the transmission frequency is performed. In case the existing phase shift $\rho_1$ is greater than the predetermined phase shift $\rho$, in step 5b, a lessening of the transmission frequency is performed. Since the existing phase shift $\rho_1$ is known, the frequency can be directly adjusted by the correspondingly needed amount, in order to obtain the predetermined phase shift $\rho$. Otherwise, i.e. in the case in which only the direction of the needed frequency correction is known, the frequency can be adjusted by a fixed amount. In this case, the predetermined phase shift $\rho$ is reached after correspondingly many cycles. Preferably, the method is repeated without interruption, continuously from step 2, so that the phase is continually controlled.

Figure 3:
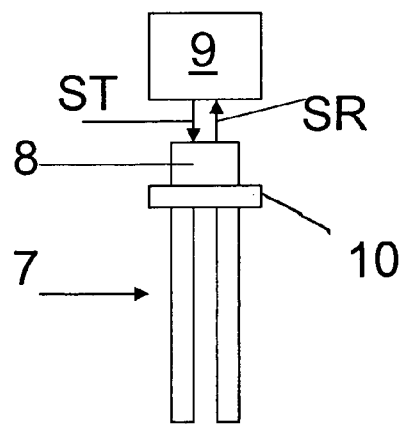
FIG. 3 illustrates the electromechanical transducer, the driving/receiving unit and the control/evaluation unit

FIG. 3 illustrates an oscillatory system in the form of a vibronic fill level device having an electronics unit 9 and a driver/receiving unit 8, between which transmission signals ST and received signals SR are transmitted. The driver/receiving unit 8 is mounted above a diaphragm 10. Mounted below the diaphragm 10 are a pair of oscillating elements 7.

The invention claimed is:

1. A method for the control of a current phase shift between a transmission signal and a received signal of an electromechanical transducer unit to a predetermined phase shift in an oscillatory circuit, comprising the steps of:
   sampling the received signal at discrete points in time predetermined based on the transmission signal;
   comparing sampled voltage values in each case, with a desired value, which the received signal assumes at the respective points in time, when the predetermined phase shift is present; and,
   in the case of a deviation of a voltage value from its desired value, at least based on the sign of the deviation, the frequency of the transmission signal is decreased or increased.

2. The method as claimed in claim 1, wherein:
   the electromechanical transducer unit is excited to execute oscillations at the beginning of the control with a frequency, at which the transmission signal at least approximately has the predetermined phase shift to the received signal.

3. The method as claimed in claim 1, wherein:
   said deviation of the current phase shift from the predetermined phase shift is quantitatively registered and the frequency increased or decreased corresponding to the quantitative deviation.

4. The method as claimed in claim 1, wherein:
   at least one voltage value is sampled within an oscillation period.

5. The method as claimed in claim 1, wherein:
   the received signal is sampled at points in time, at which the received signal crosses zero when the predetermined phase shift is present.

6. The method as claimed in claim 1, wherein:
   the received signal is sampled at points in time, at which the received signal is at an extreme when the predetermined phase shift is present.

7. The method as claimed in claim 5, wherein:
   the voltage value sampled at a point in time, at which the received signal is extreme when the predetermined phase shift is present, is compared with the voltage value sampled at a point in time, at which the received signal has a zero crossing when the predetermined phase shift is present, and,
   from the comparison, the frequency is determined, with which readjusting is performed.

8. An apparatus for determining and/or monitoring at least one process variable, comprising:
   an oscillatable unit;
   a electromechanical transducer unit, which excites said oscillatable unit to execute mechanical oscillations and receives oscillations from such and converts them into an electrical, received signal; and
   a control/evaluation unit, which produces from the received signal a transmission signal for the electromechanical transducer unit, wherein:
   the frequency of the transmission signal is set in such a manner that essentially a predetermined phase shift is present between the transmission signal and the received signal;
   said control/evaluation unit is embodied in such a manner that it controls the current phase shift between transmission signal and received signal to the predetermined phase shift;
   said control/evaluation unit samples the received signal at discrete points in time predetermined based on the transmission signal, compares sampled voltage values, in each case, with a desired value, which the received signal assumes at the respective point in time, when the predetermined phase shift is present, and, in the case of a deviation, decreases or increases the frequency of the transmission signal, at least based on the sign of the deviation.

* * * * *